United States Patent
Takahashi et al.

(10) Patent No.: US 9,066,436 B2
(45) Date of Patent: Jun. 23, 2015

(54) FLEXIBLE WIRING BOARD AND DISPLAY DEVICE

(75) Inventors: Masahiro Takahashi, Osaka (JP); Isao Kajima, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 420 days.

(21) Appl. No.: 13/503,319

(22) PCT Filed: Oct. 4, 2010

(86) PCT No.: PCT/JP2010/067344
§ 371 (c)(1),
(2), (4) Date: Apr. 20, 2012

(87) PCT Pub. No.: WO2011/048932
PCT Pub. Date: Apr. 28, 2011

(65) Prior Publication Data
US 2012/0200545 A1 Aug. 9, 2012

(30) Foreign Application Priority Data
Oct. 22, 2009 (JP) ................................. 2009-243796

(51) Int. Cl.
G09G 3/36 (2006.01)
G06F 3/038 (2013.01)
H05K 1/02 (2006.01)
H05K 1/11 (2006.01)
H05K 3/28 (2006.01)

(52) U.S. Cl.
CPC .............. *H05K 1/118* (2013.01); *H05K 1/0275* (2013.01); *H05K 3/281* (2013.01); *H05K 2201/048* (2013.01); *H05K 2201/055* (2013.01); *H05K 2201/10598* (2013.01)

(58) Field of Classification Search
CPC ............. G09G 3/36; G06F 3/038; H05K 1/02
USPC ...................................... 345/204, 87; 174/254
See application file for complete search history.

(56) References Cited

U.S. PATENT DOCUMENTS

2008/0265502 A1* 10/2008 Dobashi ........................ 271/292

FOREIGN PATENT DOCUMENTS

| JP | 10-326947 A | | 12/1998 |
| JP | 2003-142875 A | | 5/2003 |
| JP | 2003142875 | * | 5/2003 |
| JP | 2009-3142 A | | 1/2009 |

* cited by examiner

*Primary Examiner* — Timothy Thompson
*Assistant Examiner* — Charles Pizzuto
(74) *Attorney, Agent, or Firm* — Chen Yoshimura LLP

(57) ABSTRACT

A flexible wiring board includes a base member having flexibility, a write terminal section which is formed on the base member and which is a section to be protected, a protecting section which is integrally formed with the base member and which is folded back so as to cover the write terminal section, and a slit which is formed in the base member in a position that overlaps with the protecting section in a folded state and into which the protecting section can be inserted.

19 Claims, 12 Drawing Sheets

FLEXIBLE WIRING BOARD AND DISPLAY DEVICE

TECHNICAL FIELD

The present invention relates to a flexible wiring board and a display device.

BACKGROUND ART

Display devices typified by portable terminal devices such as mobile phones and PDAs, as well as electronic devices such as computers and televisions are provided with numerous electronic components on their interior, and these electronic components are electrically connected to each other by a flexible wiring board or the like. There are cases in which components such as a driver IC for driving a liquid crystal are mounted on this flexible wiring board, but there is a possibility of this driver IC being subjected to the effect of external electromagnetic waves, which causes a liquid crystal panel to malfunction. In light of this, the technique described in Patent Document 1 mentioned below is known as one example of countermeasure against electromagnetic waves.

In this technique, a shielding section composed of a conductive layer is formed on a portion of a flexible wiring board, and this shielding section is folded back to cover a driver IC, thereby shielding the driver IC.

RELATED ART DOCUMENTS

Patent Documents

Patent Document 1: Japanese Patent Application Laid-Open Publication No. 2003-142875

Problems to be Solved by the Invention

However, in the technique described in the aforementioned Patent Document 1, the shielding section is simply folded back so as to cover the driver IC, and there is nothing that is particularly devised to retain the shape of the shielding section covering the driver IC. Because of this, when the liquid crystal panel and the flexible wiring board are assembled into the outer packaging member, for example, during the manufacturing process, there is a possibility that the shielding section will end up returning to the original shape due to its own spring characteristics, and if this happens, there is a concern that the shielding function cannot be exhibited properly.

In order to retain the shape of the shielding section, it is conceivable to use a separate adhesive tape or the like to fix the shielding section, for example. However, not only does the work of fixing by means of the adhesive tape become necessary, but the material cost involving the adhesive tape also becomes necessary and the like, resulting in an increase in cost.

SUMMARY OF THE INVENTION

The present invention was perfected based on the aforementioned circumstances, and the object thereof is to retain the shape of the protecting section at a low cost.

Means for Solving the Problems

The flexible wiring board of the present invention includes a base member having flexibility, a section to be protected, formed on the base member, a protecting section integrally formed with the base member, the protecting section being folded back so as to cover the section to be protected, and a slit formed in the base member in a position that overlaps with the protecting section in a folded state, the protecting section being inserted into the slit.

This way, when the protecting section formed integrally with the base member is folded back, the protecting section is caused to cover the section to be protected, which makes it possible to accomplish the protection of the section to be protected. At this point, if the protecting section is inserted into the slit that is formed in the base member in a position that overlaps with the folded protecting section, a portion of the protecting section inserted into the slit comes into contact with the surface of the base member on the side opposite from the surface on the side of the section to be protected, which makes it possible to regulate the protecting section returning to the original shape. Consequently, it is possible to retain the shape of the protecting section in a folded state. Furthermore, because the retention of the shape of the protecting section is achieved by the slit formed in the base member, compared to a case in which an adhesive tape or the like is used to fix the protecting section, it is possible to meet the needs at a low cost.

The following configurations are preferable as embodiments of the present invention:

(1) The slit is configured so as to be open at an end portion of the base member. When the folded protecting section is to be inserted into the slit, it is preferable to deform the base member so as to open the slit. Therefore, by configuring the slit so as to be open at an end portion of the base member, the degree of freedom in terms of deforming the base member is increased, so workability when inserting the folded protecting section into the slit is superior. Moreover, in terms of forming the slit in the base member as well, it becomes easier to form the slit.

(2) The protecting section is segmented by the slit as a boundary into a covering section that is caused to cover the section to be protected and an inserting section that is inserted into the slit, the inserting section being formed to be wider than the slit. In this way, because the slit is configured so as to be open at an end portion of the base member, the inserting section which is wider than the slit can be inserted easily. Because the inserting section is wider than the slit, compared to a case in which the inserting section is formed with the width equivalent to the slit, the contact surface area of the inserting section with the surface of the base member on the side opposite from the surface on the side of the section to be protected becomes large. This makes it possible to retain the shape of the protecting section more securely.

(3) The protecting section is such that the covering section is formed to be wider than the slit, and at a position of the boundary between the covering section and the inserting section, a second slit is formed so as to be open on a side opposite from a side on which an aforementioned slit is open. By doing so, because the covering section which is wider than the slit is caused to cover the section to be protected, compared to a case in which the covering section is formed with the width equivalent to the slit, the protecting surface area can be made large, so it is possible to protect the section to be protected more securely. Meanwhile, at the boundary position between the covering section and the inserting section of the protecting section, the second slit is formed which is configured so as to be open on the side opposite from the side on which the slit is open, so when the protecting section is folded back, the inserting section can be inserted into the slit as a result of the slit and the second slit being interlocked together, while deforming the base member so as to open the slit and also while deforming the protecting section so as to open the second slit. This makes it possible to accomplish the retention of the shape of the protecting section having the covering section and the inserting section that are both wider than the slit.

(4) The protecting section is formed such that a width dimension is approximately the same between the covering section and the inserting section. By doing so, compared to a case in which the width dimensions are differentiated between the covering section and the inserting section, the shape of the protecting section can be made simple, so handling characteristics and the like are superior.

(5) The slit and the second slit are formed such that cut depths of the respective slits are approximately the same. In this way, the work of opening the slit and the second slit can be performed easily in the insertion of the inserting section into the slit.

(6) The protecting section extends from an end portion of the base member. By doing so, compared to a case in which a portion of the base member is formed as the protecting section by cutting in the base member, it is easier for the worker performing the work of folding back the protecting section to identify the protecting section, so the workability is superior.

(7) The protecting section is formed such that a position at which the protecting section is folded back nearly coincides with a base end position of an extension from the base member. If this is done, when the protecting section is folded back, the fold-back position thereof nearly coincides with the base end position of extension from the base member, i.e., an end portion of the base member, so there is no outward protrusion of the protecting section from the end portion of the base member. Accordingly, this is superior in terms of external appearance and also saves space.

(8) The slit is configured so as to conform to a fold-back line of the protecting section. In this way, in a state in which the protecting section is folded back and a portion thereof is inserted into the slit, it is possible to ensure the portion of the protecting section that covers the section to be protected at a constant length over the entire width thereof.

(9) The section to be protected serves as a terminal section electrically connected to a connecting device to which the flexible wiring board is to be connected. In this way, by protecting the terminal section with the protecting section, it is possible to prevent adverse effects such as malfunction on the connecting device which is the object of connection via the terminal section.

(10) A conductive section, which is to be kept at a specified potential and which can contact the terminal section, is formed on a surface of the protecting section that faces the terminal section. If this is done, by causing the conductive section that is kept at a specified potential to contact the terminal section, the two can be kept at the same potential, so it is possible to prevent the potential of the terminal section from fluctuating due to external noise and the like.

(11) The conductive section is connected to ground. In this way, the terminal section can be connected to ground via the conductive section.

(12) The protecting section is formed with a neck forming slit that is open at an end portion along a fold-back line of the protecting section. By doing so, a neck is formed in the fold-back part of the protecting section by the neck forming slit, so the workability when folding back the protecting section is superior.

(13) The neck forming slits are formed in a pair at either end portion of the protecting section. In this way, the workability when folding back the protecting section is even more superior.

Next, in order to solve the problems described above, the display device of the present invention is a display device including any of the aforementioned flexible wiring boards, a display panel that has electrode wiring lines and that performs display in accordance with drive signals supplied to the electrode wiring lines, and a display control circuit that controls transmission of the drive signals, wherein the display panel and the display control circuit are connected by the flexible wiring board.

With such a display device, the flexible wiring board which connects the display panel and the display control circuit is able to retain the shape of the protecting section at a low cost, so a cost reduction can be achieved.

A liquid crystal panel exemplifies the aforementioned display panel. Such a display device is suitable as a liquid crystal display device in various applications, for example, for various types of electronic device such as portable information terminals, mobile phones, notebook computers, and portable game devices.

Effects of the Invention

The present invention makes it possible to retain the shape of the protecting section at a low cost.

DETAILED DESCRIPTION OF EMBODIMENTS

Embodiment 1

Embodiment 1 of the present invention will be described based on FIGS. 1 to 6. In the present embodiment, a liquid crystal display device 10 will be shown as an example. This liquid crystal display device 10 is used for various types of electronic devices (not illustrated) such as portable information terminals, mobile phones, notebook computers, and portable game devices. Note that the X axis, Y axis, and Z axis are indicated in a portion of each figure, and depiction is such that the direction of each axis is the direction indicated in each figure. Furthermore, with regard to the up-down direction, FIG. 2 or the like is used as the reference, and the upper side in FIG. 2 is taken as the front side, while the lower side in FIG. 2 is taken as the back side.

Figure 1:
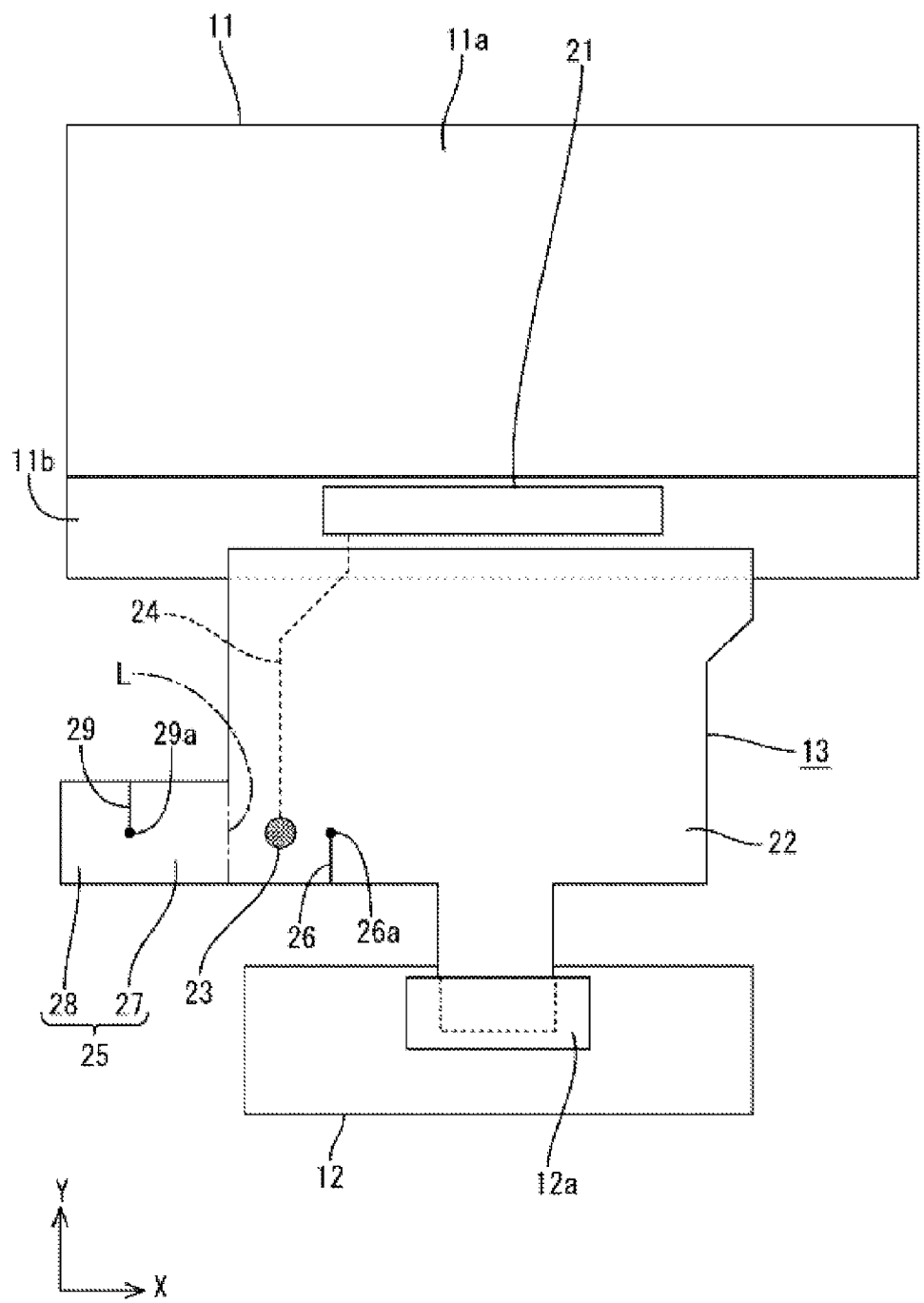
FIG. 1 is a schematic plan view showing a configuration of the connection between a liquid crystal panel, a flexible wiring board, and a display control circuit board according to Embodiment 1 of the present invention.
Figure 2:
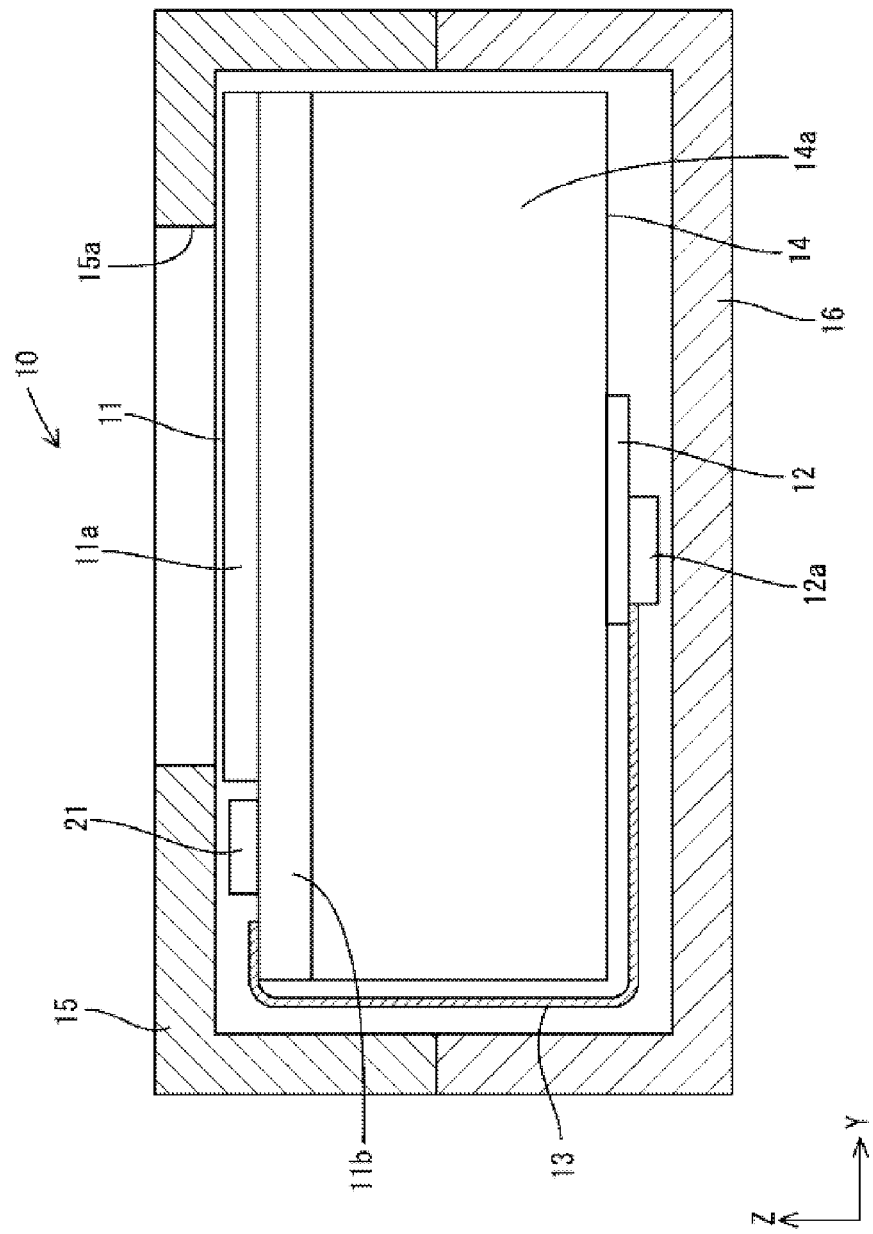
FIG. 2 is a sectional view showing the configuration of a cross section along the direction of the short side of the liquid crystal display device.

As shown in FIGS. 1 and 2, the liquid crystal display device 10 includes a liquid crystal panel 11 which is the display panel (display element) displaying an image, a display control circuit board 12 which controls transmission of drive signals that drive the liquid crystal panel 11, a flexible wiring board 13 which electrically connects the liquid crystal panel 11 and the display control circuit board 12, and a backlight device (illumination device) 14 which is the external light source that supplies light to the liquid crystal panel 11. Moreover, the liquid crystal display device 10 also includes a pair of front and back outer packaging members 15 and 16 for housing and holding the liquid crystal panel 11 and the backlight device 14 that are assembled with each other, and of these, the front-side outer packaging member 15 is formed with an opening part 15a for exposing the display surface of the liquid crystal panel 11 to the outside.

First, the backlight device 14 will be briefly described. The backlight device 14 includes a chassis 14a that has a substantially box shape and that is open on the front side (on the side of the liquid crystal panel 11), light source disposed inside the chassis 14a (not illustrated; e.g., cold cathode tubes and LEDs), and an optical member disposed so as to cover the opening part of the chassis 14a (not illustrated). The optical member has functions such as converting light emitted from the light source to planar light.

Next, the liquid crystal panel 11 will be described. The liquid crystal panel 11 has a horizontally elongated rectangular shape (square shape) as a whole and includes a pair of substrates 11a and 11b made of transparent (having translucency) glass and a liquid crystal layer (not illustrated) which is interposed between the two substrates 11a and 11b and which contains liquid crystal molecules constituting a substance whose optical properties change with the application of an electric field, and the two substrates 11a and 11b are bonded together by a sealant (not illustrated) in a state in which a gap corresponding to the thickness of the liquid crystal layer is maintained. Note that the direction of the long side in the liquid crystal panel 11 coincides with the X-axis direction, while the direction of the short side coincides with the Y-axis direction.

Figure 3:
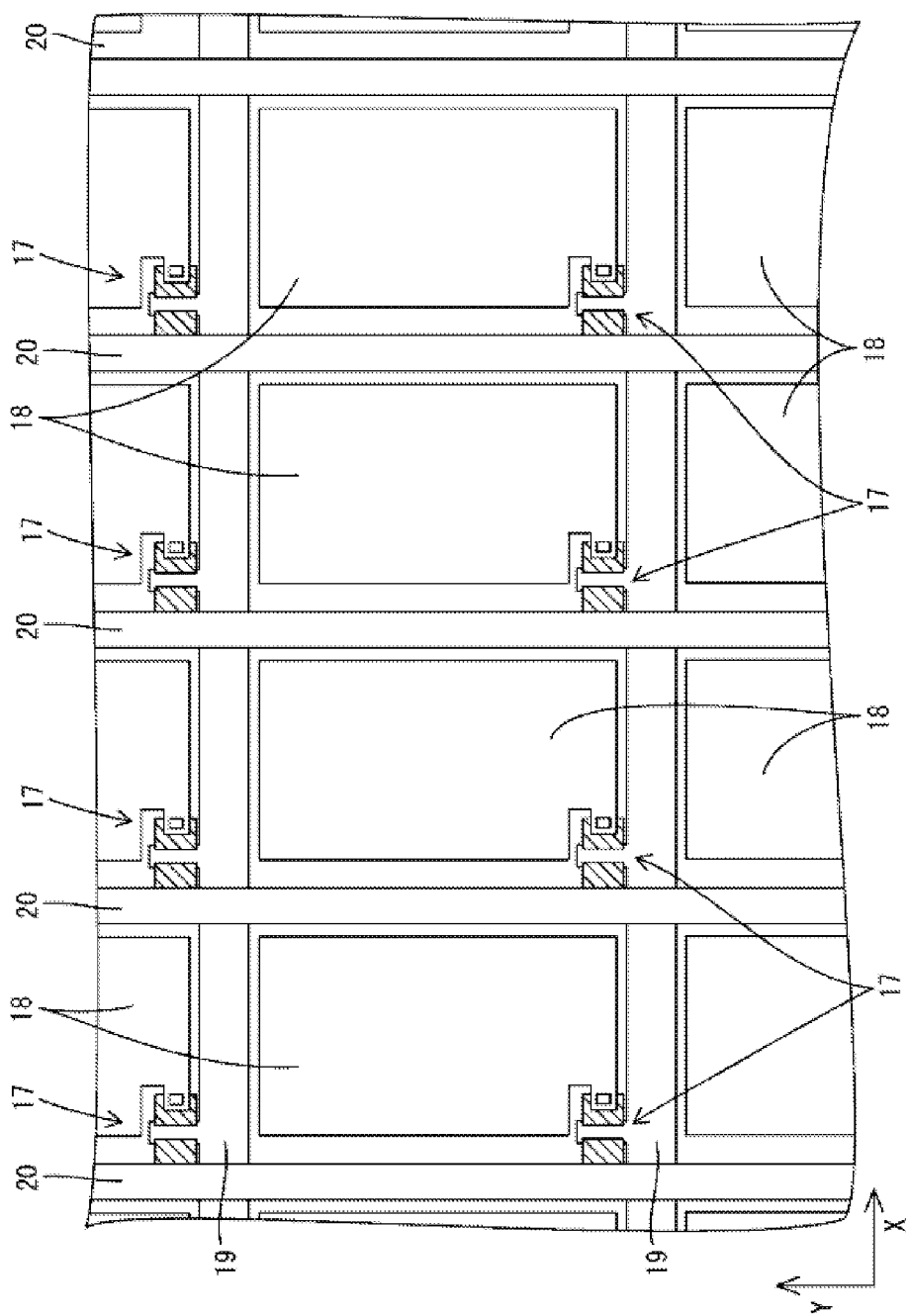
FIG. 3 is an enlarged plan view showing the wiring configuration on the array substrate of the liquid crystal panel.

Between the two substrates 11a and 11b, the one on the front side (front surface side) is a CF substrate 11a, while the one on the back side (back surface side) is an array substrate 11b. As shown in FIG. 3, numerous TFTs (Thin-Film Transistors) 17 constituting switching elements and pixel electrodes 18 are provided side by side on the side of the inner surface (on the side of the liquid crystal layer and on the side of the surface facing the CF substrate 11a) of the array substrate 11b, and gate wiring lines 19 and source wiring lines 20 forming a grid shape are arranged around these TFTs 17 and pixel electrodes 18 so as to respectively surround and enclose these. The gate wiring lines 19 and the source wiring lines 20 are respectively connected to the gate electrodes and source electrodes of the TFTs 17, and the pixel electrodes 18 are connected to the drain electrodes of the TFTs 17. Terminal sections that are led around from the gate wiring lines 19 and source wiring lines 20 are formed at one end portion in the short side direction of the array substrate 11b, and these terminal sections have a driver IC 21 for driving the liquid crystal mounted thereon by COG (Chip On Glass) as shown in FIGS. 1 and 2 and also have the output terminal of this driver IC 21 connected thereto. In addition, relay wiring (not illustrated) connected to the input terminal of the driver IC 21 is formed at one end portion in the short side direction of the array substrate 11b, and one end of the aforementioned flexible wiring board 13 is connected to the terminal section formed at an end portion of this relay wiring. Accordingly, drive signals from the display control circuit board 12 are transmitted to the respective wiring lines 19 and 20 via the flexible wiring board 13 and the driver IC 21. The flexible wiring board 13 and the driver IC 21 are connected by pressure bonding to each of the terminal sections via an anisotropic conductive film (ACF) which is not illustrated. Furthermore, the pixel electrodes 18 are composed of transparent electrodes of indium tin oxide (ITO) or zinc oxide (ZnO).

Meanwhile, the CF substrate 11a is provided with a color filter in which respective colored sections of R (red), G (green), B (blue), and the like are disposed in an arrangement corresponding to each of the pixels. A light shielding layer (black matrix) for preventing color mixing is formed between respective colored sections constituting the color filter. An opposite electrode that faces the pixel electrodes on the side of the array substrate 11b is provided on the surfaces of the color filter and light shielding layer. This CF substrate 11a is made to be slightly smaller than the array substrate 11b. Moreover, alignment films for aligning the liquid crystal molecules contained in the liquid crystal layer are respectively formed on the side of the inner surfaces of the two substrates 11a and 11b. Note that polarizing plates (not illustrated) are respectively affixed to the side of the outer surfaces of the two substrates 11a and 11b.

As shown in FIGS. 1 and 2, the display control circuit board 12 is attached by screws or the like to the back surface (the outer surface on the side opposite from the side of the liquid crystal panel 11) of the chassis 14a of the backlight device 14. This display control circuit board 12 is formed by mounting an electronic component (control circuit) which controls the transmission of the drive signals to the liquid crystal panel 11 on a substrate made of paper phenol or glass epoxy resin, routing and forming an electrically conducting path (not illustrated) in a specified pattern, and also mounting a connector 12a connected to the electrically conducting path. Then, as a result of the other end of the flexible wiring board 13 being inserted in this connector 12a, the electrical connection between the display control circuit board 12 and the flexible wiring board 13 is established, thus making it possible to transmit the drive signals.

Next, the flexible wiring board (FPC board) 13 will be described in detail. As shown in FIG. 2, the flexible wiring board 13 is to be connected to the array substrate 11b of the liquid crystal panel 11 and the display control circuit board 12 disposed on the back surface of the chassis 14a of the backlight device 14 and is therefore bent such that the sectional shape is a substantially "U" shape inside the liquid crystal display device 10.

To describe a concrete configuration, the flexible wiring board 13 includes a base member 22 having insulation properties and flexibility, and a wiring pattern (not illustrated) with numerous wiring lines is present on this base member 22. This wiring pattern is designed such that one end portion thereof is connected to the terminal section on the side of the liquid crystal panel 11, while the other end portion is connected to the connector 12a of the display control circuit board 12. In addition, the base member 22 by and large has a horizontally elongated rectangular shape in plan view and has high insulation properties and flexibility by being formed in the form of a film composed of a polyimide-based resin or the like.

Furthermore, a write terminal section 23 for writing specified information in memory provided in the driver IC 21 during the manufacturing process is formed on a first surface 22a of the base member 22. This write terminal section 23 is disposed so as to be exposed to the outside on the first surface 22a of the base member 22 and is connected to the driver IC 21 via a write wiring line 24 formed on the base member 22. Moreover, the write terminal section 23 is disposed in the vicinity of the lower-left corner position of the base member 22 shown in FIG. 1. This write terminal section 23 is designed such that the terminal section (not illustrated) of a device for writing information from the outside can come into contact therewith during the manufacturing process, which makes it possible to write information such as a flicker adjustment value or a setting value regarding the y curve, for example, in the memory provided in the driver IC 21. In addition, the first surface 22a of the base member 22 on which the write terminal section 23 is formed is the surface oriented toward the outside (toward the outer packaging members 15 and 16) inside the liquid crystal display device 10 (FIG. 2). Note that the respective wiring patterns including the write wiring 24 are covered by an insulating layer which is not illustrated, thus avoiding the exposure to the outside.

Incidentally, if another conductive terminal from the outside, for instance, contacts the aforementioned write terminal section 23, or if static electricity, noise, or the like affects it, there is a possibility of the driver IC 21 being subjected to electrical effect and causing malfunction or the like. In light of this, in the present embodiment, the protection of the write terminal section 23 is accomplished by forming a protecting section 25 integrally with the base member 22 and folding this protecting section 25 back to cover the write terminal section 23. In addition, in the present embodiment, in order to retain the shape of the protecting section 25 in a folded state, a slit 26 into which the protecting section 25 can be inserted is formed in the base member 22. The configuration of the protecting section 25 and slit 26 will be described below in detail. Note that the write terminal section 23 is used only during the manufacturing process and is not normally used after the completion of the manufacture (after a product is created), so the flexible wiring board 13 is assembled into the outer packaging members 15 and 16 in a state in which the write terminal section 23 is still covered by the protecting section 25.

As shown in FIG. 1, the protecting section 25 is configured from a cantilever piece section (tongue piece) that extends from an end portion of the base member 22, and in concrete terms, it is configured so as to extend to the left from the end portion on the left side of the base member 22 shown in FIG. 1 along the X-axis direction. The protecting section 25 is disposed so as to correspond to the write terminal section 23 which is the object of protection with respect to the Y-axis direction, and the central position thereof in the Y-axis direction nearly coincides with the central position in the Y-axis direction of the write terminal section 23. Furthermore, the protecting section 25 forms in a coplanar manner with the end portion on the lower side shown in FIG. 1 (end portion where the slit 26 which will be described next is open) of the base member 22 with respect to the Y-axis direction. Then, the protecting section 25 is designed to be folded back along a fold-back line L (indicated by the one-dot-chain line in FIG. 1) so as to cover the first surface 22a of the base member 22 on which the write terminal section 23 is formed. The fold-back line L forms a straight line along the Y-axis direction (direction orthogonal to the direction of extension) and is set in a position which nearly coincides with the base end position of extension of the protecting section 25 from the base member 22, i.e., the end portion of the base member 22. Accordingly, in a folded state, the protecting section 25 does not protrude outward from the end portion of the base member 22 in the X-axis direction (FIG. 4).

In relation to this, the slit 26 is disposed in the base member 22 in a position which overlaps with the protecting section 25 in a folded state, and the distance to the fold-back line L is set to be smaller than the length dimension of the protecting section 25 which will be described later. In other words, the slit 26 is disposed so as to be positioned in the base member 22 on the side opposite from the side of the fold-back line L (folded-back portion 25a of the protecting section 25) with respect to the write terminal section 23 which is the object of protection. To put it in yet another way, the write terminal section 23 is positioned between the fold-back line L and the slit 26. This slit 26 is configured so as to extend almost in a straight line in a manner conforming to the fold-back line L (Y-axis direction). The slit 26 is configured so as to be open at the end portion of the base member 22 on the lower side shown in FIG. 1 and divides this end portion left and right with respect to the X-axis direction. This makes it possible to deform the portions of the base member 22 divided by the slit 26 so as to be turned over and to open the slit 26 easily. Moreover, a circular part 26a having a circular shape in plan view is formed at the end portion of the slit 26 on the side opposite from the side of the opening end portion, and this prevents the occurrence of cutting in the base member 22. The circular part 26a is disposed such that the center thereof is in a position that is almost the same as the central position of the write terminal section 23 with respect to the Y-axis direction.

In addition, the protecting section 25 is formed such that the length dimension thereof (the dimension in the X-axis direction) is larger than the distance from the fold-back line L to the write terminal section 23 and also the distance from the fold-back line L to the slit 26 and such that the tip end portion thereof is inserted into the slit 26. As shown in FIGS. 4 and 5, the protecting section 25 in a folded state in its entirety overlaps with the base member 22 and can be segmented with the slit 26 as the boundary between a covering section 27 which is formed so as to face the first surface 22a of the base member 22 (the surface having the write terminal section 23 mounted thereon) and which is caused to cover the write terminal section 23 and an inserting section 28 which is inserted into the slit 26 and which is formed so as to face the second surface 22b of the base member 22.

Figure 4:
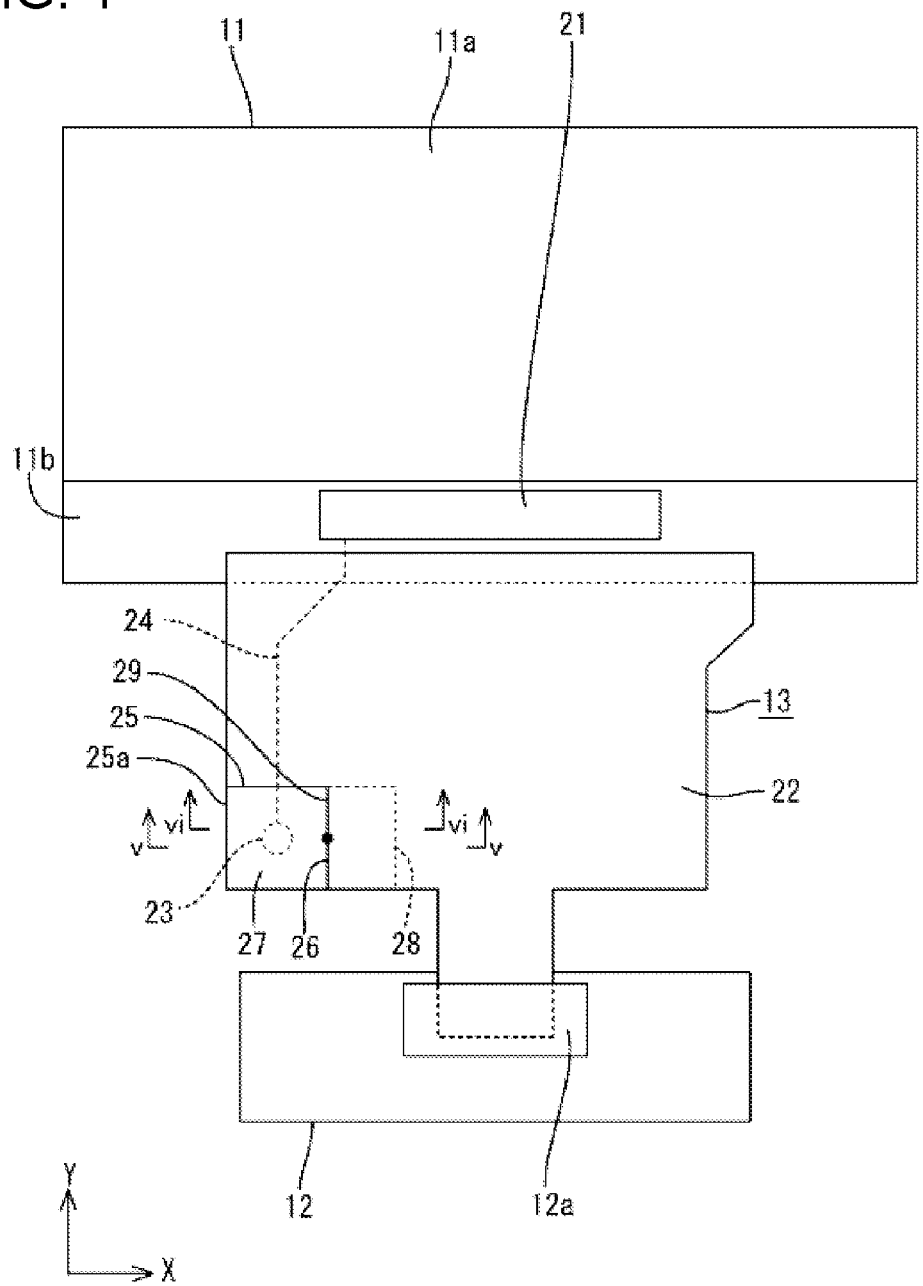
FIG. 4 is a schematic plan view of the flexible wiring board showing a state in which the protecting section is folded back.
Figure 5:
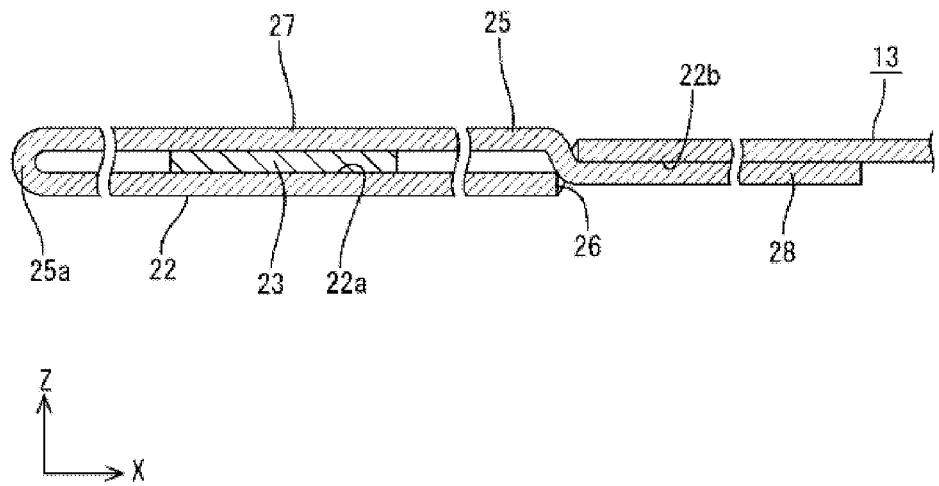
FIG. 5 is a sectional view along line v-v in FIG. 4.

Of these, the covering section 27 is configured from a specified region of the protecting section 25 toward the base end of extension, i.e., the portion from the fold-back part 25a to the slit 26 in a folded state, and covers the first surface 22a of the base member 22 along with the write terminal section 23 over a specified range as shown in FIGS. 4 and 5. The write terminal section 23 is disposed in the central position of the covering section 27 in a folded state with respect to the X-axis direction and Y-axis direction, and the entire region thereof is covered along with the peripheral region on the base member 22 by the covering section 27. The inserting section 28 is configured from a specified region of the protecting section 25 toward the tip end portion of extension and is designed to contact the second surface 22b of the base member 22 on the side opposite from the side of the write terminal section 23 in a state of being inserted into the slit 26. In an inserted state, the inserting section 28 overlaps with a specified region of the base member 22 adjacent to the slit 26 on the side opposite from the side of the write terminal section 23 in the X-axis direction, and nearly the entire region of the inserting section 28 also contacts the second surface 22b in this overlapped portion in a surface contact state. This makes it possible to regulate the protecting section 25 using its own spring characteristics to return to the opened shape (original shape) prior to being folded back. This regulating force is designed to be proportional to the contact surface area of the inserting section 28 with the base member 22. Thus, the protecting section 25 is such that the portion toward the base end of extension is formed as the covering section 27 which functions to protect the write terminal section 23, while the portion toward the tip end of extension is formed as the inserting section 28 which functions to retain the shape of the protecting section 25.

Incidentally, as shown in FIG. 1, the protecting section 25 is formed such that the width dimension thereof (the dimension in the Y-axis direction) is constant over the entire length and such that the size thereof is larger than the cut depth of the slit 26. That is, the covering section 27 and the inserting section 28 that make up the protecting section 25 are formed such that the width dimension thereof is the same and is also wider than the slit 26. Consequently, the surface area in the covering section 27 that covers the write terminal section 23, i.e., the protecting surface, can be sufficiently ensured, and the contact surface area of the inserting section 28 with the second surface 22b of the base member 22 can also be sufficiently ensured. Furthermore, a second slit 29 is formed in the protecting section 25 at the boundary position between the covering section 27 and the inserting section 28 in order to allow the insertion of the protecting section 25 which is wider than the slit 26 over the entire region into the slit 26.

Figure 6:
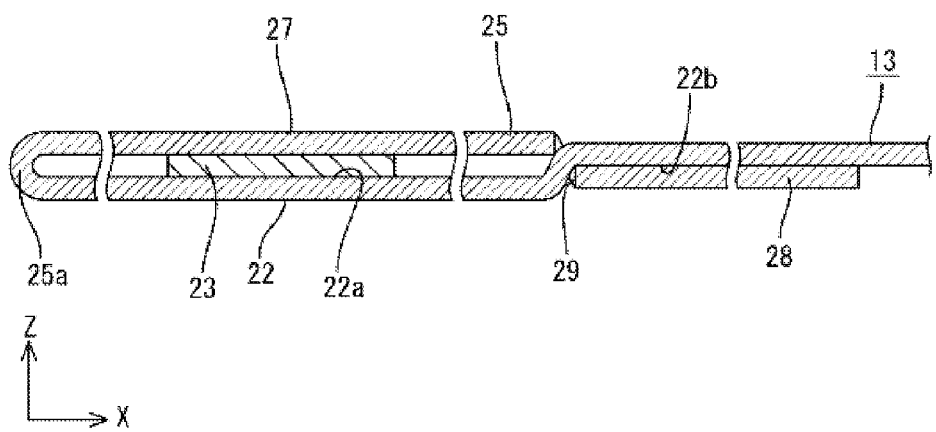
FIG. 6 is a sectional view along line vi-vi in FIG. 4.

The second slit 29 is configured so as to extend almost in a straight line in a manner conforming to the slit 26 and the fold-back line L (Y-axis direction). The second slit 29 is configured so as to be open at the end portion of the protecting section 25 on the upper side shown in FIG. 1 in the Y-axis direction, i.e., toward the side opposite from the side on which the slit 26 is open in the base member 22, and divides this end portion left and right with respect to the X-axis direction. This makes it possible to deform the portions of the protecting section 25 divided by the second slit 29 so as to be turned over and to open the second slit 29 easily. Then, at the time of insertion of the inserting section 28 into the slit 26, if the slit 26 and the second slit 29 are interlocked together while opening both of these two, the entire region of the inserting section 28 which is wider than the slit 26 can be inserted into the first slit 26 as shown in FIGS. 4 to 6, and the entire region of the covering section 27 which is wider than the slit 26 can be caused to cover the base member 22 and securely protect the write terminal section 23. In this folded state, as shown in FIG. 4, the second slit 29 forms a straight line with the slit 26, and the entire region of the protecting section 25 overlaps with the base member 22. Moreover, as in the slit 26, a circular part 29a having a circular shape in plan view is formed in the end portion of the second slit 29 on the side opposite from the side of the opening end portion.

The present embodiment has the structure described above, and the actions thereof will be described next. The first end of the flexible wiring board 13 is connected by pressure bonding via an anisotropic conductive film to the terminal section of the array substrate 11b of the liquid crystal panel 11 which is manufactured using a known manufacturing method and which is in a state of having the driver IC 21 for driving the liquid crystal mounted thereon (FIG. 1). Afterward, the terminal section of a device for writing information from the outside is caused to contact the write terminal section 23 of the flexible wiring board 13, and information relating to the driving of the liquid crystal such as a flicker adjustment value or a setting value regarding the y curve, for example, is also written in the memory provided in the driver IC 21.

Upon completion of the writing work, the protecting section 25 is folded back from the state shown in FIG. 1 toward the first surface 22a of the base member 22 and folded along the fold-back line L, and the work of inserting the inserting section 28 which is the tip end portion of this protecting section 25 into the slit 26 is performed. At the time of the insertion work, the slit 26 is opened as a result of the end portions of the base member 22 divided by the slit 26 being deformed so as to be turned over, and the second slit 29 is also opened as a result of the end portions of the protecting section 25 divided by the second slit 29 being deformed so as to be turned over; at the same time, the two slits 26 and 29 are interlocked together, and the inserting section 28 is passed through the slit 26. Then, as shown in FIGS. 5 and 6, the protecting section 25 is sandwiched between the two edge portions of the slit 26, and the base member 22 is also sandwiched between the two edge portions of the second slit 29. In this state, the entire region of the inserting section 28 which is wider than the slit 26 is passed through the slit 26 and faces the second surface 22b of the base member 22, and the entire region of the covering section 27 which is wider than the slit 26 faces the first surface 22a of the base member 22.

At this point, the entire region of the write terminal section 23 is covered along with the peripheral region on the base member 22 by the covering section 27. Meanwhile, the entire region of the inserting section 28 is in contact, in a surface contact state, with a portion of the second surface 22b of the base member 22 on the side opposite from the side of the write terminal section 23 with respect to the slit 26. Consequently, even if the protecting section 25 is about to return to the original opened shape by means of its own spring characteristics, this restoring action is regulated by the inserting section 28 and the base member 22 abutting each other, thus making it possible to retain the shape of the protecting section 25 in a folded state. Thus, because the protecting section 25 is devised so as to retain the shape by being inserted into the slit 26 in the base member 22, compared to a case in which an adhesive tape or the like is used to retain the shape, the retention of the shape can be achieved sufficiently at a low cost. In addition, because the inserting section 28 is wider than the slit 26, the contact surface area with the base member 22 is sufficiently ensured, so the retention of the shape of the protecting section 25 can be accomplished reliably with a high regulating force. Furthermore, as a result of both edge portions of the slit 26 being in contact with the protecting section 25 and also as a result of both edge portions of the second slit 29 being in contact with the base member 22, a frictional resistance force is generated, and this frictional resistance force can also be used to regulate the protecting section 25 returning to the original opened shape, so a high shape retention function can be exhibited.

When the work of folding the protecting section 25 is completed as described above, the work of assembling the liquid crystal panel 11 to the backlight device 14 is performed. At this point, the flexible wiring board 13 is bent along the X-axis direction to make the sectional shape in a substantially "U" shape, and at the same time, the second end thereof is inserted in the connector 12a of the display control circuit board 12 disposed on the back surface side of the chassis 14a (FIG. 2). Afterward, the liquid crystal panel 11 and the backlight device 14 that are connected to each other via the flexible wiring board 13 are housed inside the outer packaging members 15 and 16, thus obtaining the liquid crystal display device 10 as shown in FIG. 2.

Incidentally, during the time from the work of folding back the protecting section 25 to the completion of the liquid crystal display device 10, the flexible wiring board 13 is placed in a state of being exposed to the outside, so there is a concern of another conductive terminal from the outside coming into contact with the write terminal section 23 or of static electricity or noise from the outside affecting the write terminal section 23. In the present embodiment, however, as shown in FIGS. 5 and 6, as a result of the protecting section 25 being folded back and inserted into the slit 26, the write terminal section 23 is covered over the entire region thereof by the covering section of the protecting section 25 and is also maintained in a state of being sandwiched between the covering section and the base member 22, so the exposure to the outside is almost completely avoided. Accordingly, it is possible to prevent the aforementioned situation of another conductive terminal from the outside directly making contact with the write terminal section 23, and it is also made unlikely that static electricity or noise from the outside will directly affect the write terminal section 23. This makes it possible to avoid the situation of the driver IC 21 receiving the electrical effect via the write terminal section 23, which can, in turn, prevent the driver IC 21 from malfunctioning.

Note that the write terminal section 23 which is the object of protection of the protecting section 25 is normally not used once the writing of information in the driver IC 21 is completed, but in cases where there is a need to correct the information written in the driver IC 21, the work of rewriting information may be performed. In such cases as well, because the protecting section 25 covering the write terminal section 23 is devised to retain the shape by being inserted into the slit 26 in the base member 22, compared to the case of achieving the retention of the shape with an adhesive tape or the like, the protecting section 25 can be returned to the original shape easily without damaging the flexible wiring board 13, and can be folded back again to cover the write terminal section 23. Accordingly, it is possible to avoid inadvertently damaging the flexible wiring board 13, and workability relating to the rewriting work is also superior.

As described above, the flexible wiring board 13 of the present embodiment includes the base member 22 having flexibility, the write terminal section 23 which is formed on the base member 22 and which is the section to be protected, the protecting section 25 which is formed integrally with the base member 22 and which is folded back so as to cover the write terminal section 23, and the slit 26 which is formed in the base member 22 in a position that overlaps with the protecting section 25 in a folded state and into which the protecting section 25 can be inserted.

This way, when the protecting section 25 that is integrally formed with the base member 22 is folded back, the protecting section 25 is caused to cover the write terminal section 23, which can accomplish the protection of the write terminal section 23. At this point, if the protecting section 25 is inserted into the slit 26 formed in the base member 22 in a position that overlaps with the folded protecting section 25, a portion of the protecting section 25 inserted into the slit 26 comes into contact with the surface 22*b* of the base member 22 on the side opposite from the surface 22*a* on the side of the write terminal section 23, thus making it possible to regulate the protecting section 25 returning to the original shape. Consequently, the shape of the protecting section 25 in a folded state can be retained. Moreover, because the slit 26 formed in the base member 22 is used to achieve the retention of the shape of the protecting section 25, compared to the case of using an adhesive tape or the like to fix the protecting section 25, it is possible to meet the needs at a low cost. Thus, with the present embodiment, the retention of the shape of the protecting section 25 can be accomplished at a low cost.

In addition, the slit 26 is configured so as to be open at an end portion of the base member 22. When the folded protecting section 25 is inserted into the slit 26, it is preferable that the base member 22 be deformed so as to open the slit 26. Therefore, by configuring the slit 26 so as to be open at the end portion of the base member 22, the degree of freedom in terms of deforming the base member 22 becomes high, so the workability is superior at the time of insertion of the folded protecting section 25 into the slit 26. Furthermore, in terms of forming the slit 26 in the base member 22 as well, it becomes easier to form the slit 26.

Moreover, the protecting section 25 is segmented with the slit 26 as the boundary between the covering section 27 that is caused to cover the write terminal section 23 and the inserting section 28 inserted into the slit 26, and the inserting section 28 is formed to be wider than the slit 26. By doing so, because the slit 26 is configured so as to be open at the end portion of the base member 22, the inserting section 28 that is wider than the slit 26 can easily be inserted. Because the inserting section 28 is wider than the slit 26, compared to a case in which the inserting section is formed with a width equivalent to the slit 26, the contact surface area of the inserting section 28 with the surface 22*b* of the base member 22 on the side opposite from the surface 22*a* on the side of the write terminal section 23 is large. Consequently, the retention of the shape of the protecting section 25 can be made more reliably.

In addition, the protecting section 25 is such that the covering section 27 is formed to be wider than the slit 26 and also such that the second slit 29 which is configured so as to be open on the side opposite from the side on which the slit 26 is open is formed in the boundary position between the covering section 27 and the inserting section 28. By doing so, the covering section 27 that is wider than the slit 26 is caused to cover the write terminal section 23, so compared to a case in which the covering section is formed with a width equivalent to the slit 26, the protecting surface area can be made large, thus making it possible to protect the write terminal section 23 more securely. Meanwhile, because the second slit 29 which is configured so as to be open on the side opposite from the side on which the slit 26 is open is formed in the protecting section 25 at the boundary position between the covering section 27 and the inserting section 28, when the protecting section 25 is folded back, while deforming the base member 22 so as to open the slit 26 and also while deforming the protecting section 25 so as to open the second slit 29, the slit 26 and the second slit 29 are interlocked together. This allows the inserting section 28 to be inserted into the slit 26, which makes it possible to achieve the retention of the shape of the protecting section 25 having the covering section 27 and the inserting section 28 that are both wider than the slit 26.

Furthermore, the protecting section 25 is formed such that the width dimension is approximately the same between the covering section 27 and the inserting section 28. By doing so, compared to a case in which the width dimensions are different between the covering section 27 and the inserting section 28, the shape of the protecting section 25 can be made simple, so handling characteristics and the like are superior.

Moreover, the slit 26 and the second slit 29 are formed such that the cut depths are approximately the same. Because of this, in the insertion of the inserting section 28 into the slit 26, the work of opening the slit 26 and the second slit 29 can be performed easily.

In addition, the protecting section 25 is configured so as to extend from the end portion of the base member 22. By doing so, compared to a case in which a portion of the base member is formed as the protecting section 25 by cutting in the base member, it is easier for the worker performing the work of folding back the protecting section 25 to identify the protecting section 25, so the workability is superior.

Furthermore, the protecting section 25 is formed such that the fold-back position thereof nearly coincides with the base end position of extension from the base member 22. In this way, when the protecting section 25 is folded back, this fold-back position nearly coincides with the base end position of extension from the base member 22, i.e., the end portion of the base member 22, so there is no outward protrusion of the protecting section 25 from the end portion of the base member 22. Accordingly, this is superior in terms of external appearance and also saves space.

Moreover, the slit 26 is configured so as to conform to the fold-back line L of the protecting section 25. By doing so, in a state in which the protecting section 25 is folded back and a portion thereof is inserted into the slit 26, a portion of the protecting section 25 that covers the write terminal section 23 can be ensured over the entire width thereof at a certain length.

In addition, the write terminal section 23 serves as the terminal section that is electrically connected to the driver IC 21 for driving the liquid crystal that constitutes the connecting device which is the object of connection for this flexible wiring board 13. If this is done, by protecting the write terminal section 23 with the protecting section 25, it is possible to prevent adverse effects such as malfunction on the driver IC 21 for driving the liquid crystal which is the object of connection via the write terminal section 23.

Furthermore, the liquid crystal display device 10 according to the present embodiment includes the aforementioned flexible wiring board 13, the liquid crystal panel 11 which has the gate wiring lines 19 and source wiring lines 20 as the electrode wiring lines and which performs display on the basis of drive signals supplied to these gate wiring lines 19 and source wiring lines 20, and the display control circuit board 12 which controls the transmission of the drive signals, and this liquid crystal display device 10 is formed by connecting the liquid crystal panel 11 and the display control circuit board 12 by means of the flexible wiring board 13. With such a liquid crystal display device 10, the flexible wiring board 13 which connects the liquid crystal panel 11 and the display control circuit board 12 is able to achieve the retention of the shape of the protecting section 25 at a low cost, so a cost reduction can be achieved.

Embodiment 2

Embodiment 2 of the present invention will be described based on FIGS. 7 to 9. In this Embodiment 2, a flexible wiring board is shown in which the write terminal section 23 is connected to ground. Note that a redundant description regarding the structures, actions, and effects that are the same as in the aforementioned Embodiment 1 will be omitted.

Figure 7:
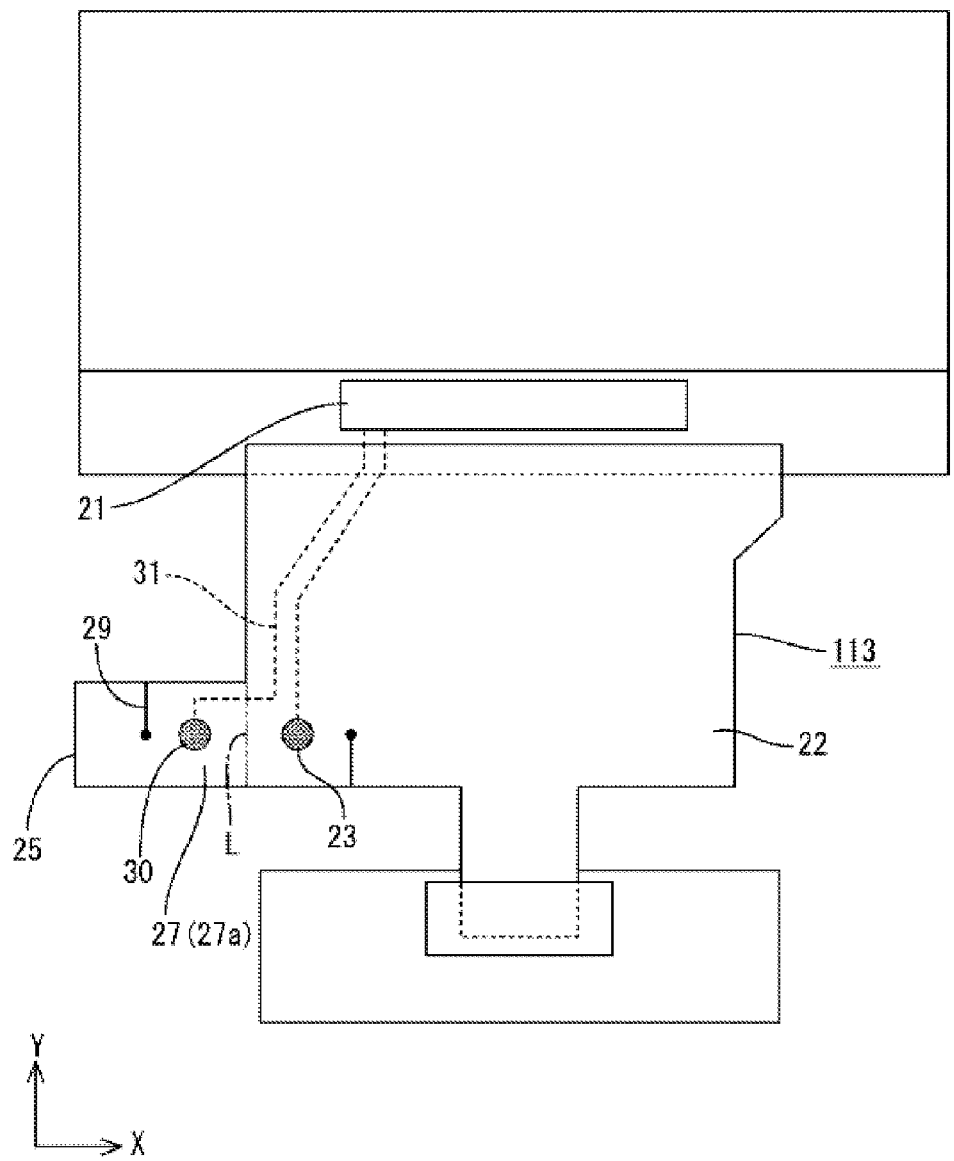
FIG. 7 is a schematic plan view showing a configuration of the connection between a liquid crystal panel, a flexible wiring board, and a display control circuit board according to Embodiment 2 of the present invention.

A ground terminal section 30 that is connected to ground is formed on the protecting section 25 of the flexible wiring board 113 as shown in FIG. 7. This ground terminal section 30 is primarily connected to the driver IC 21 via a ground wiring line 31 formed on the protecting section 25 and the base member 22, and is secondarily connected to ground and is therefore constantly maintained at a ground potential in a stable manner. The ground terminal section 30 is formed on the covering section 27 of the protecting section 25 that is caused to cover the write terminal section 23 and is formed on a surface 27a of the covering section 27 that faces the write terminal section 23 (base member 22) in a folded state (FIG. 9). The ground terminal section 30 is disposed on the side opposite from the write terminal section 23 with the fold-back line L in between with respect to the X-axis direction, and the distance to the fold-back line L is approximately the same as that for the write terminal section 23. That is, it can be said that the ground terminal 30 is disposed in a linearly symmetrical position with the write terminal section 23 with respect to the fold-back line L. Moreover, the ground terminal section 30 is disposed on the protecting section 25 in approximately the central position between the second slit 29 and the fold-back line L with respect to the X-axis direction.

Figure 8:
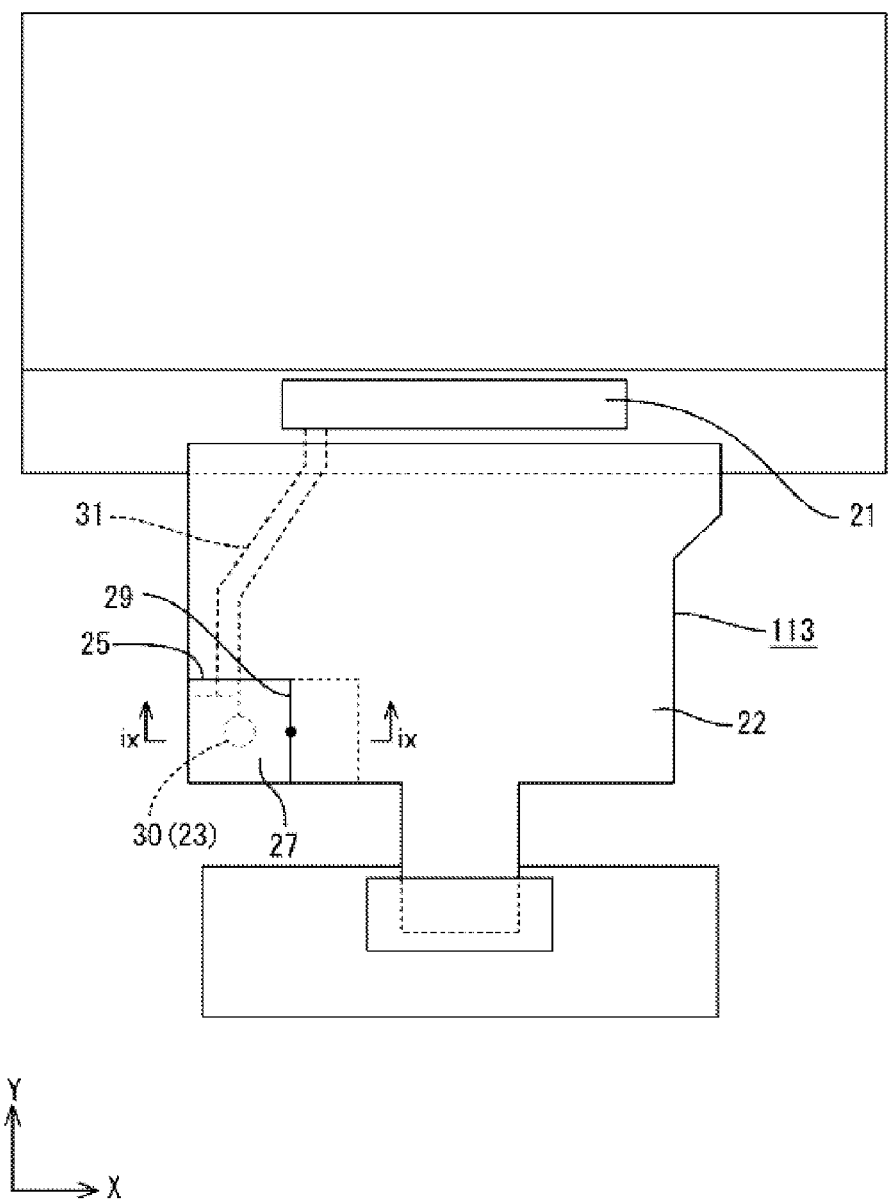
FIG. 8 is a schematic plan view of the flexible wiring board showing a state in which the protecting section is folded back.
Figure 9:
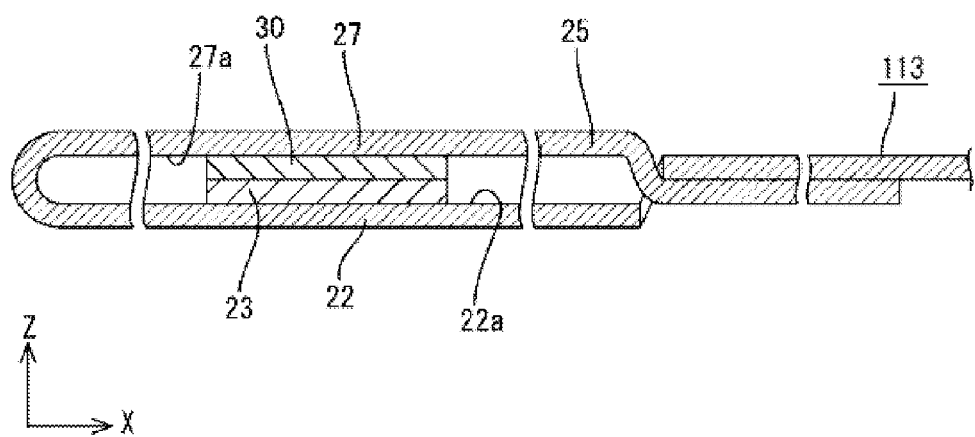
FIG. 9 is a sectional view along line ix-ix in FIG. 8.

When the protecting section 25 in the opened shape is folded back along the fold-back line L, the covering section 27 of the protecting section 25 is caused to cover the write terminal section 23 as shown in FIGS. 8 and 9. At this point, the ground terminal section 30 formed on the surface 27a of the covering section 27 that faces the write terminal section 23 comes into contact with the write terminal section 23. In this state, the ground terminal section 30 and the write terminal section 23 that are disposed symmetrically to each other overlap over nearly the entire region in plan view and also achieve contact with each other. Consequently, the write terminal section 23 is stably kept at the same potential as that of the ground terminal section 30, i.e., at the ground potential, so it is possible to prevent the potential of the write terminal section 23 from fluctuating due to external noise and the like.

As described above, with the present embodiment, the ground terminal section 30 which is kept at a specified potential and which is a conductive section capable of contacting the write terminal section 23 is formed on the surface of the protecting section 25 that faces the write terminal section 23. In this way, because the ground terminal section 30 that is kept at a specified potential is caused to contact the write terminal section 23, the two sections 23 and 30 can be kept at the same potential, which makes it possible to prevent the potential of the write terminal section 23 from fluctuating due to external noise and the like.

In addition, the ground terminal section 30 which is a conductive section is connected to ground. By doing so, the write terminal section 23 can be connected to ground via the ground terminal section 30.

Embodiment 3

Embodiment 3 of the present invention will be described based on FIG. 10. In this Embodiment 3, a flexible wiring board in which a neck 33 is formed in the protecting section 225 is shown. Note that a redundant description regarding the structures, actions, and effects that are the same as in the aforementioned Embodiment 1 will be omitted.

Figure 10:
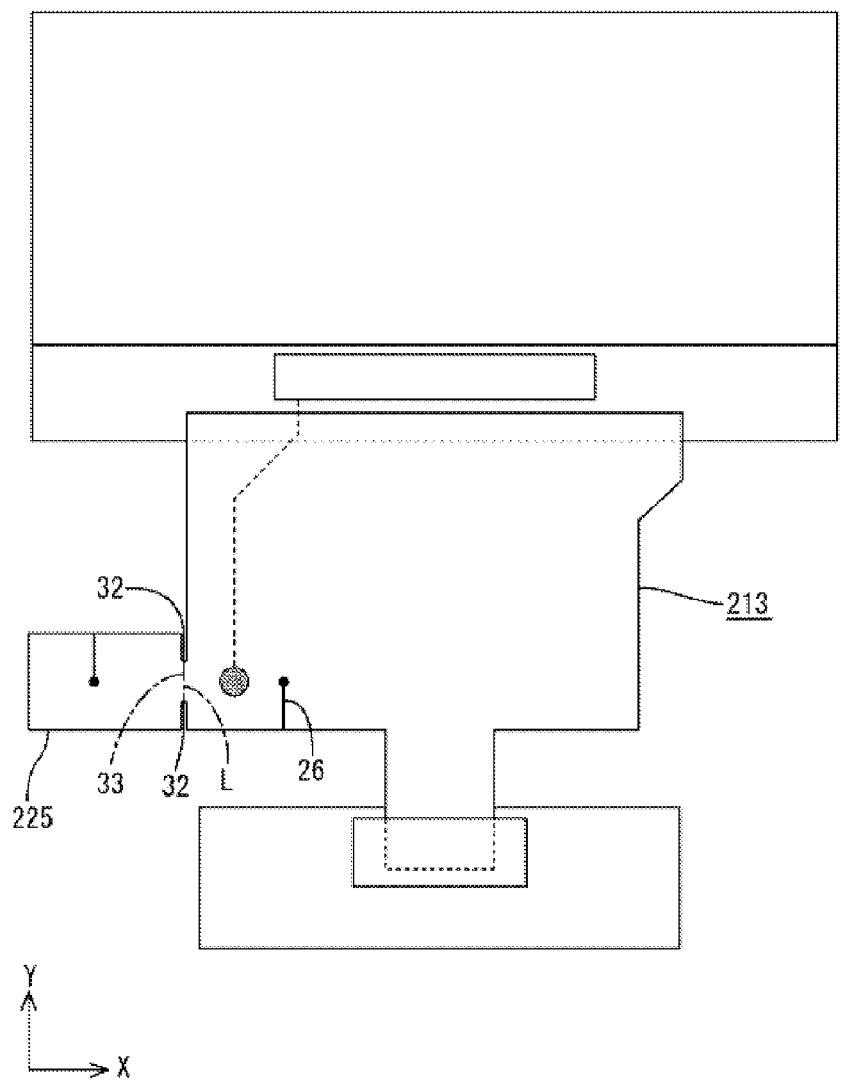
FIG. 10 is a schematic plan view of the flexible wiring board according to Embodiment 3 of the present invention.

Neck forming slits 32 are formed in the protecting section 225 of the flexible wiring board 213 as shown in FIG. 10. The neck forming slits 32 are configured so as to be open at the end portions along the fold-back line L (Y-axis direction) at the base end position of extension (fold-back part) of the protecting section 225. The neck forming slits 32 are formed in a pair at either end portion of the protecting section 225 in the direction of width, and the cut depth thereof is mutually the same. In concrete terms, the cut depth of each of the neck forming slits 32 is approximately ⅓ of the width dimension of the protecting section 225. The neck 33 that is narrower than the other area is formed by these neck forming slits 32 at the base end position of extension (fold-back part) of the protecting section 225. This increases the degree of freedom in deforming the protecting section 225 when the protecting section 225 is folded back along the fold-back line L, so the work of inserting the protecting section 225 into the slit 26 when folded back is facilitated.

As described above, with the present embodiment, the protecting section 225 is formed with the neck forming slits 32 that are open at the end portions along the fold-back line L thereof. Because of this, the neck 33 is formed by the neck forming slits 32 at the fold-back part of the protecting section 225, so workability when folding back the protecting section 225 is superior.

Furthermore, the neck forming slits 32 are formed in a pair at either end portion of the protecting section 225. In this way, workability when folding back the protecting section 225 is even more superior.

Embodiment 4

Embodiment 4 of the present invention will be described based on FIG. 11. In this Embodiment 4, a flexible wiring board in which the shape of the protecting section 325 is modified is shown. Note that a redundant description regarding the structures, actions, and effects that are the same as in the aforementioned Embodiment 1 will be omitted.

Figure 11:
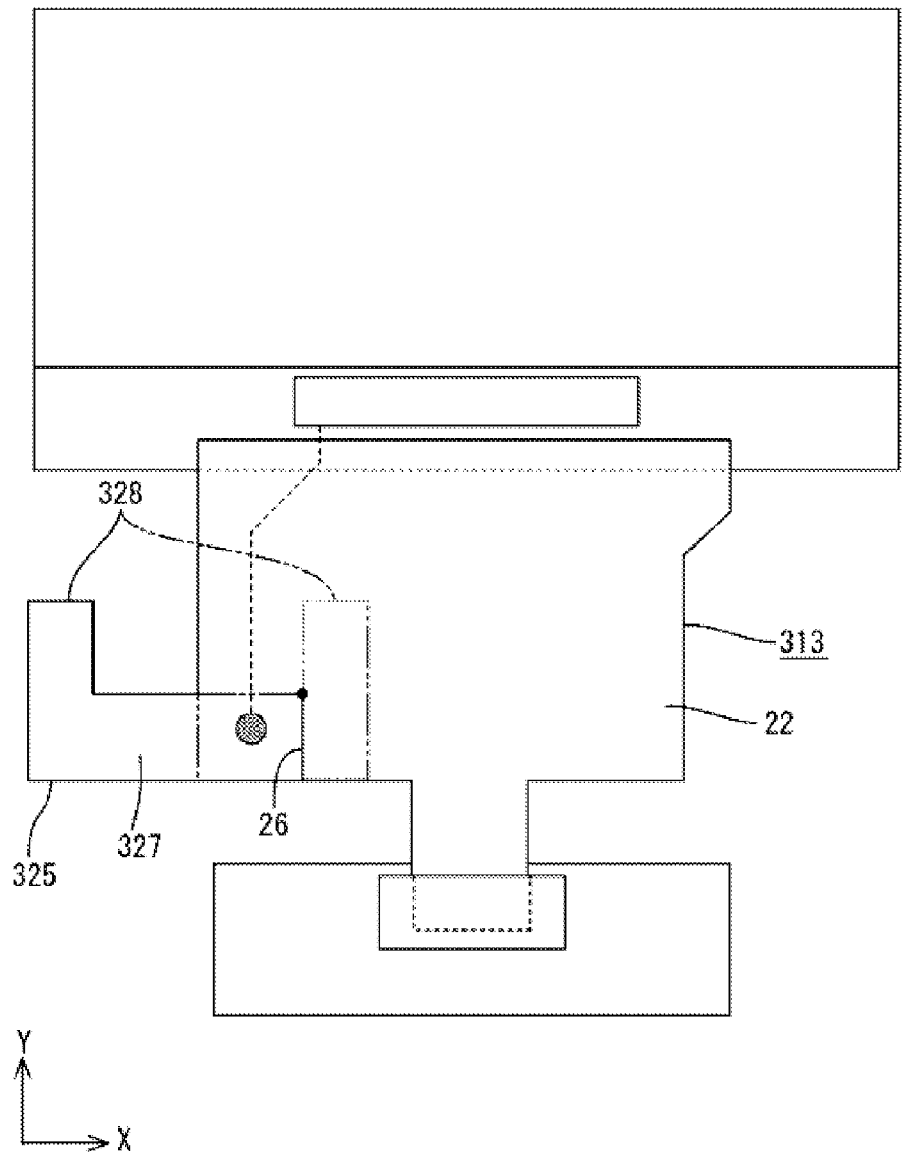
FIG. 11 is a schematic plan view of the flexible wiring board according to Embodiment 4 of the present invention.

The protecting section 325 of the flexible wiring board 313 is formed such that the width dimensions are different between the covering section 327 and the inserting section 328 as shown in FIG. 11. To elaborate this, the protecting section 325 has the shape of the letter L as a whole in plan view and is formed such that the inserting section 328 on the side of the tip end of extension is wider than the covering section 327 on the side of the base end of extension. Because of this, there is no second slit 29 such as that of Embodiment 1 formed at the boundary position between the covering section 327 and the inserting section 328. While the width dimension of the covering section 327 is made to be approximately the same size as the cut depth of the slit 26 in the base member 22, the width dimension of the inserting section 328 is made to be larger than the cut depth of this slit 26. In a state in which the protecting section 325 is folded back (indicated by the two-dot chain line in FIG. 11), as a result of the inserting section 328 which is wider than the covering section 327 and the slit 26 being in contact with the base member 22 over the entire region thereof, the retention of the shape of the protecting section 325 can be achieved stably.

Other Embodiments

The present invention is not limited to the embodiments described based on the aforementioned description and figures, and the following embodiments, for instance, are also included in the technological scope of the present invention.

Figure 12:
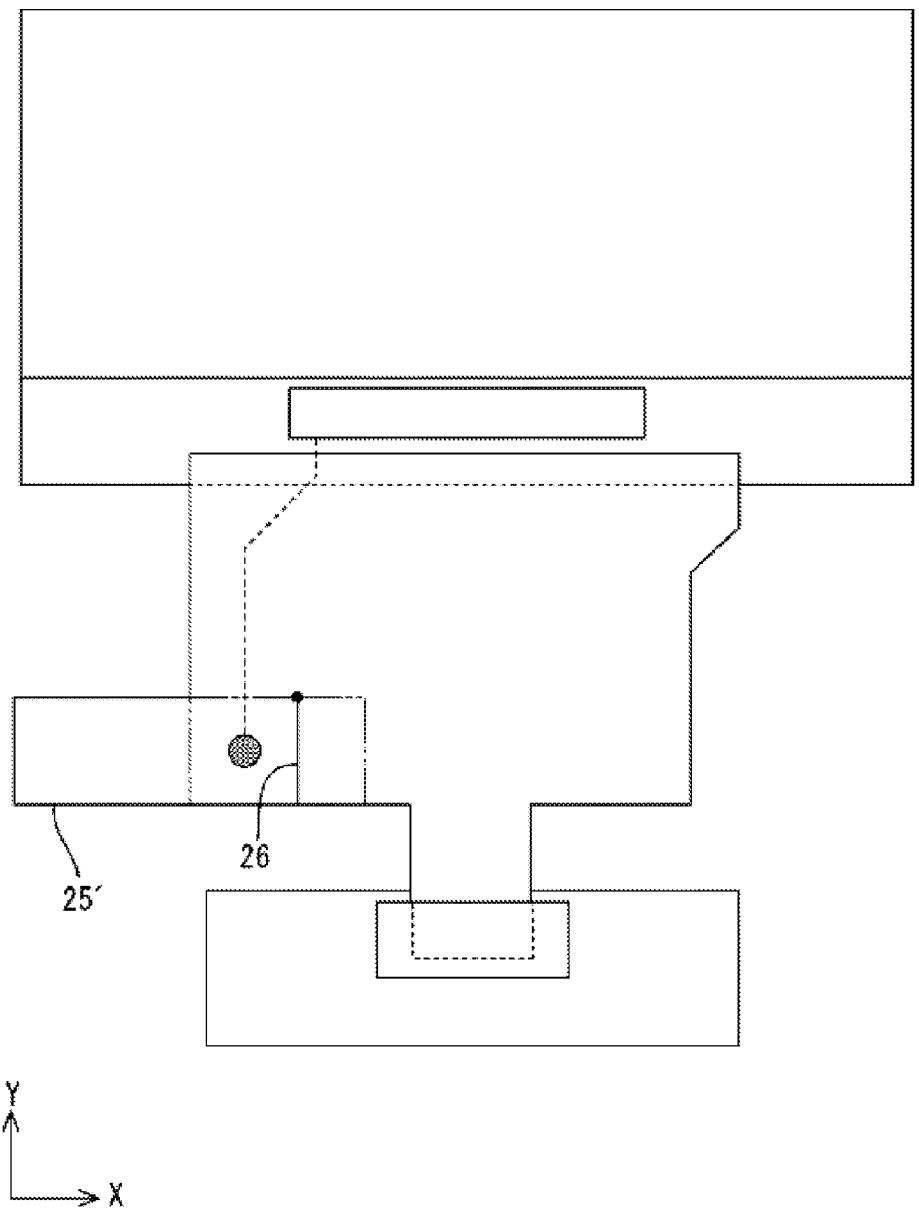
FIG. 12 is a schematic plan view of the flexible wiring board according to another embodiment (1) of the present invention.

(1) In each of the aforementioned embodiments, a flexible wiring board was shown in which the entire region of the protecting section or the inserting section is wider than the cut depth of the slit, but as shown in FIG. 12, the present invention includes an embodiment in which the width dimension of the protecting section 25' is constant over the entire length and is also approximately the same size as the cut depth of the slit 26.

Figure 13:
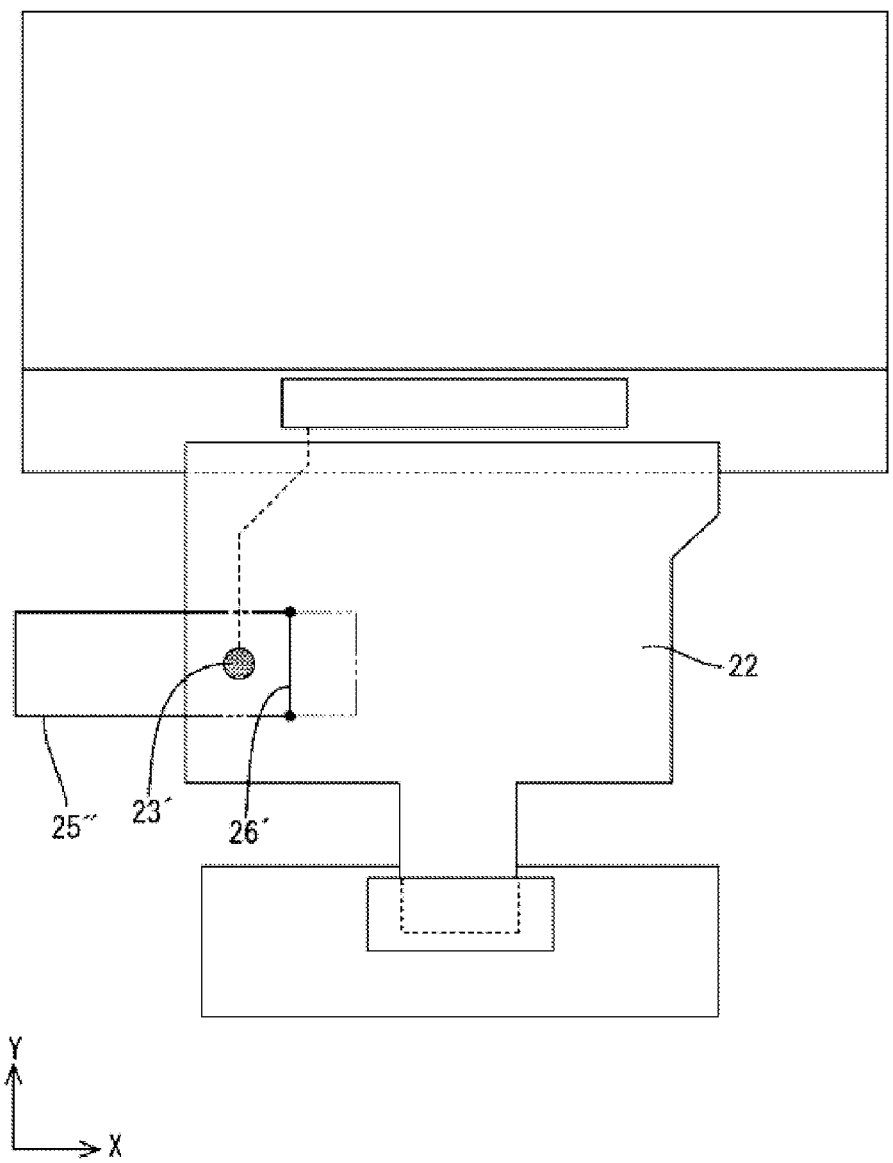
FIG. 13 is a schematic plan view of the flexible wiring board according to another embodiment (2) of the present invention.

(2) In each of the aforementioned embodiments, a flexible wiring board was shown in which the slit is configured so as to be open at an end portion of the base member, but as shown in FIG. 13, the present invention also includes an embodiment in which the slit 26' is configured so as not to be open at an end portion of the base member 22. In FIG. 13, the disposition of the write terminal section 23' on the base member 22 is modified toward the center with respect to the Y-axis direction, and to correspond to this, the slit 26' and the protecting section 25" are disposed on the base member 22 toward the center with respect to the Y-axis direction. In this way, the formation range of the slit 26' can be restricted, so the effect on the wiring patterns on the base member 22 can be alleviated.

(3) Besides the aforementioned respective embodiments, if a shielding layer is formed by lamination on the protecting section, for example, the write terminal section can be shielded, which makes it possible to improve the noise-resistance performance of the driver IC.

(4) In the aforementioned Embodiments 1 to 3, a flexible wiring board was shown in which the total of the cut depths of the slit and second slit added together nearly coincides with the width dimension of the protecting section, but it is also possible to set these slits such that the added size of the cut depths of the slit and second slit exceeds the width dimension of the protecting section.

(5) In (1) and (2) described above, a flexible wiring board was shown in which the cut depth of the slit nearly coincides with the width dimension of the protecting section, but it is also possible to set the slit such that the cut depth of the slit exceeds the width dimension of the protecting section.

(6) In the aforementioned Embodiments 1 to 3, a flexible wiring board was shown in which the cut depth is approximately the same size between the slit and the second slit, but the slit and the second slit can be set with different cut depths. In this case, the cut depth size of the slit can be greater or shorter than the cut depth size of the second slit.

(7) In the aforementioned Embodiments 1 to 3, a flexible wiring board was shown in which the width dimension of the protecting section having the second slit is constant over the entire length, but it is also possible to differentiate the width dimension of the protecting section having the second slit between the covering section and the inserting section. In this case, the width dimension size of the covering section can be greater or smaller than the width dimension size of the inserting section.

(8) In each of the aforementioned embodiments, a flexible wiring board was shown in which the slit in the base member is configured so as to conform to the fold-back line, but the present invention also includes an embodiment in which the slit in the base member is configured so as to be inclined with respect to the fold-back line. Besides that, the shape of the slit in the base member is not limited to a straight line, and a curved shape, e.g., a circular arc shape, may also be used. Note that the concrete configuration of the second slit in the protecting section can also be modified as appropriate in the same manner as in the aforementioned slit.

(9) In each of the aforementioned embodiments, a flexible wiring board was shown in which the protecting section is configured so as to extend from an end portion of the base member along the X-axis direction, but the present invention also includes an embodiment in which the protecting section is configured so as to extend from an end portion of the base member along the Y-axis direction. In this case, it is preferable that the fold-back line, slit, and second slit be set along the X-axis direction. Besides that, the present invention also includes an embodiment in which the protecting section is configured so as to extend in an oblique direction with respect to both the X-axis direction and Y-axis direction.

(10) In each of the aforementioned embodiments, a flexible wiring board was shown in which the protecting section is folded back along the fold-back line that conforms to an end portion of the base member, but the present invention also includes an embodiment in which the protecting section is folded back along a fold-back line that is inclined with respect to the end portion of the base member (X-axis direction or Y-axis direction).

(11) In each of the aforementioned embodiments, a flexible wiring board was shown in which the protecting section is folded back at the base end position of extension, but the present invention also includes an embodiment in which the protecting section is folded back more toward the tip end position of extension than the base end position of extension, i.e., an embodiment in which the base end position of extension and the fold-back position do not coincide.

(12) In each of the aforementioned embodiments, a flexible wiring board was shown in which the protecting section is configured so as to extend from an end portion of the base member, but it is also possible to form a protecting section by splitting a portion of the base member with a slit or the like, for example.

(13) In Embodiment 2 described above, a flexible wiring board was shown in which the ground terminal section formed on the protecting section is caused to contact the write terminal section, but the present invention also includes an embodiment in which in place of the ground terminal section, a conductive section that is kept at a stable potential other than the ground potential is formed on the protecting section, and this conductive section is caused to contact the write terminal section.

(14) In each of the aforementioned embodiments, a flexible wiring board was shown in which the write terminal section for the driver IC for driving the liquid crystal in the liquid crystal panel is the object of protection for the protecting section, but in a flexible wiring board in which the driver IC for driving the liquid crystal is mounted on the flexible wiring board, for example, it is also possible to make this driver IC the object of protection for the protecting section. In essence, the object of protection for the protecting section is not limited to the terminal section. Moreover, the object of protection for the protecting section can be changed to a mounting component on a flexible wiring board other than the driver IC.

(15) In each of the aforementioned embodiments, a display device was shown in which one of the surfaces of the base member on which the write terminal section is formed is disposed so as to be oriented outward inside the liquid crystal display device, but it is also possible to dispose one of the surfaces of the base member on which the write terminal section is formed so as to be oriented inward (toward the backlight device) inside the liquid crystal display device.

(16) In each of the aforementioned embodiments, a flexible wiring board that is directly connected to the terminal section of the liquid crystal panel was shown as an example, but the present invention also includes a flexible wiring board which is connected to another circuit board that is connected to the terminal section of the liquid crystal panel, for instance.

(17) In each of the aforementioned embodiments, a display device was shown in which the terminal section of the liquid crystal panel is disposed at a short-side end portion of the array substrate, but the present invention also includes an embodiment in which this terminal section is disposed at a long-side end portion of the array substrate.

(18) In each of the aforementioned embodiments, a transmissive liquid crystal display device provided with a backlight device as the external light source was shown as an example, but the present invention can be applied to a reflective liquid crystal display device which performs display utilizing outside light. In this case, the backlight device can be omitted.

(19) In each of the aforementioned embodiments, TFTs were used as the switching elements of the liquid crystal display device, but the present invention can also be applied to a liquid crystal display device using the switching elements other than TFTs (e.g., thin-film diodes (TFDs)) and can also be applied to a black and white display liquid crystal display device other than a color display liquid crystal display device.

(20) In each of the aforementioned embodiments, a liquid crystal display device using a liquid crystal panel exemplified the display panel, but the present invention can also be applied to a display device using other types of display panel.

DESCRIPTION OF REFERENCE CHARACTERS 10 liquid crystal display device (display device)
11 liquid crystal panel (display panel)
12 display control circuit board (display control circuit)
13, 113, 213, 313 flexible wiring board
19 gate wiring line (electrode wiring line)
20 source wiring line (electrode wiring line)
21 driver IC (connecting device)
22 base member
23, 23' write terminal section (section to be protected, terminal section)
25, 25', 25", 225, 325 protecting section
26, 26' slit
27, 327 covering section
27a facing surface
28, 328 inserting section
29 second slit
30 ground terminal section (conductive section)
32 neck forming slit
L fold-back line

The invention claimed is:

1. A flexible wiring board comprising:
a base member having flexibility;
a section to be protected, formed on said base member;
a protecting section integrally formed with said base member, the protecting section being folded back so as to cover said section to be protected; and
a slit formed in said base member in a position that overlaps with said protecting section in a folded state, said protecting section being inserted into said slit,
wherein said slit is configured so as to be open at an end portion of said base member.

2. The flexible wiring board according to claim 1, wherein said protecting section is segmented by said slit as a boundary into a covering section that is caused to cover said section to be protected and an inserting section that is inserted into said slit, said inserting section being formed to be wider than said slit.

3. The flexible wiring board according to claim 2, wherein said protecting section is such that said covering section is formed to be wider than said slit, and at a position of the boundary between said covering section and said inserting section, a second slit is formed so as to be open on a side opposite from a side on which said slit is open.

4. The flexible wiring board according to claim 3, wherein said protecting section is formed such that a width dimension is approximately the same between said covering section and said inserting section.

5. The flexible wiring board according to claim 3, wherein said slit and said second slit are formed such that cut depths of the respective slits are approximately the same.

6. The flexible wiring board according to claim 1, wherein said protecting section extends from an end portion of said base member.

7. The flexible wiring board according to claim 6, wherein said protecting section is formed such that a position at which said protecting section is folded back nearly coincides with a base end position of an extension from said base member.

8. The flexible wiring board according to claim 1, wherein said protecting section is formed with a neck forming slit that is open at an end portion along a fold-back line of said protecting section.

9. A display device comprising:
the flexible wiring board according to claim 1;
a display panel that has electrode wiring lines and that performs display in accordance with drive signals supplied to the electrode wiring lines; and
a display control circuit that controls transmission of said drive signals,
wherein said display panel and said display control circuit are connected by said flexible wiring board.

10. A flexible wiring, comprising:
a base member having flexibility;
a section to be protected, formed on said base member;
a protecting section integrally formed with said base member, the protecting section being folded back so as to cover said section to be protected; and
a slit formed in said base member in a position that overlaps with said protecting section in a folded state, said protecting section being inserted into said slit,
wherein said slit is configured so as to conform to a fold-back line of said protecting section.

11. A flexible wiring, comprising:
a base member having flexibility;
a section to be protected, formed on said base member;
a protecting section integrally formed with said base member, the protecting section being folded back so as to cover said section to be protected; and
a slit formed in said base member in a position that overlaps with said protecting section in a folded state, said protecting section being inserted into said slit,
wherein said section to be protected serves as a terminal section electrically connected to a connecting device to which the flexible wiring board is to be connected.

12. The flexible wiring board according to claim 11, wherein a conductive section, which is to be kept at a specified potential and which can contact said terminal section, is formed on a surface of said protecting section that faces said terminal section.

13. The flexible wiring board according to claim 12, wherein said conductive section is connected to ground.

14. The flexible wiring board according to claim 8, wherein said neck forming slits are formed in a pair at either end portion of said protecting section.

15. The display device according to claim 9, wherein said display panel is a liquid crystal panel formed by sealing in a liquid crystal between a pair of substrates.

16. The flexible wiring board according to claim 11, wherein said protecting section is formed with a neck forming slit that is open at an end portion along a fold-back line of said protecting section.

17. The flexible wiring board according to claim 16, wherein said neck forming slits are formed in a pair at either end portion of said protecting section.

18. A display device comprising:
the flexible wiring board according to claim 11;
a display panel that has electrode wiring lines and that performs display in accordance with drive signals supplied to the electrode wiring lines; and
a display control circuit that controls transmission of said drive signals,
wherein said display panel and said display control circuit are connected by said flexible wiring board.

19. The display device according to claim 18, wherein said display panel is a liquid crystal panel formed by sealing in a liquid crystal between a pair of substrates.

* * * * *